(12) United States Patent
van der Zande et al.

(10) Patent No.: US 7,544,939 B2
(45) Date of Patent: Jun. 9, 2009

(54) METHOD FOR DETERMINING THE ABERRATION COEFFICIENTS OF THE ABERRATION FUNCTION OF A PARTICLE-OPTICAL LENS

(75) Inventors: Marinus Johannes van der Zande, Roosendaal (NL); Christiaan Kok, Eindhoven (NL); Bernd Rieger, Delft (NL)

(73) Assignee: FEI Company, Hillsboro, OR (US)

( * ) Notice: Subject to any disclaimer, the term of this patent is extended or adjusted under 35 U.S.C. 154(b) by 370 days.

(21) Appl. No.: 11/634,283

(22) Filed: Dec. 5, 2006

(65) Prior Publication Data
US 2007/0125945 A1    Jun. 7, 2007

(30) Foreign Application Priority Data
Dec. 6, 2005    (EP)    ................... 05111741

(51) Int. Cl.
*G01N 23/00* (2006.01)
(52) U.S. Cl. .................. 250/311; 250/306; 250/307; 250/310
(58) Field of Classification Search .............. 250/306, 250/307, 310, 311; 359/16
See application file for complete search history.

(56) References Cited
U.S. PATENT DOCUMENTS
5,581,347 A    12/1996    Le Saux et al.

6,552,340 B1*    4/2003    Krivanek et al. ............ 250/310
6,858,844 B2    2/2005    Zach

OTHER PUBLICATIONS

M. Haider, S. Uhlemann and J. Zach "Upper Limits for the Residual Aberrations of a High-Resolution Aberration-Corrected STEM," Ultramicroscopy 81 (2000) p. 163-175.

* cited by examiner

*Primary Examiner*—David A Vanore
*Assistant Examiner*—Michael Maskell
(74) *Attorney, Agent, or Firm*—Scheinberg & Griner, LLLP; Michael O. Scheinberg; David Griner

(57) ABSTRACT

A lens of particle-optical apparatus, such as the objective lens, suffers from aberrations. As is already known since decades Ronchigrams can be used to determine these aberrations of particle-optical lenses.

Figure 1:
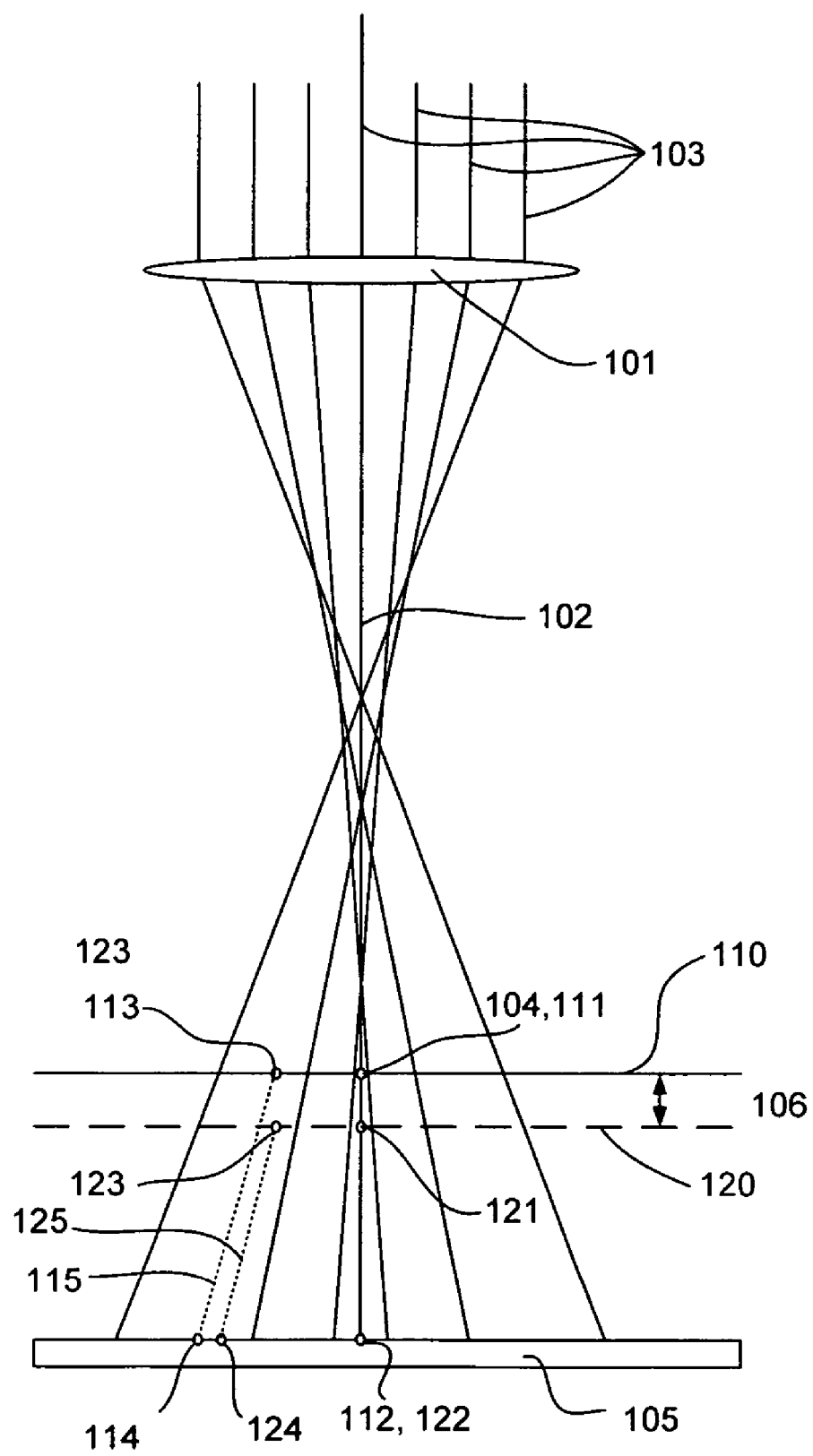

Such methods rely e.g. on the determination of the $2^{nd}$ derivative of the aberration function on the basis of local magnification in one or a set of Ronchigrams. Being dependent on the $2^{nd}$ derivative the mathematics of these methods allow only (infinitesimal) small shifts between the Ronchigrams. However, this implies that e.g. the spatial quantization noise of the camera recording the Ronchigrams results in a large error. These conflicting requirements limit the accuracy and thus the usefulness of the known methods.

The invention describes a set of algorithms which result in an improved method to quantify the lens aberration coefficients using a set of Ronchigrams.

13 Claims, 3 Drawing Sheets

METHOD FOR DETERMINING THE ABERRATION COEFFICIENTS OF THE ABERRATION FUNCTION OF A PARTICLE-OPTICAL LENS

The invention relates to a method for determining the aberration coefficients of the aberration function of a particle-optical lens, comprising:
providing an amorphous sample with specimen details,
providing a beam of particles,
providing a lens for focusing said beam in the vicinity of the sample,
detecting a $1^{st}$ transmission Ronchigram showing an image of a plurality of sample details,
changing a beam parameter by a known quantity,
detecting a $2^{nd}$ transmission Ronchigram showing an image of approximately the same sample details.

The invention also relates to a particle-optical apparatus equipped to perform the method of the invention, and to software for automatically performing the method of the invention on such an apparatus.

Such a method is known from the U.S. Pat. No. 6,552,340.

The method is used during the alignment of particle-optical elements of a particle-optical apparatus, such as a Scanning Transmission Electron Microscopes (STEM). More specifically this method is used for adjusting a corrector, said corrector correcting lens aberrations in such an apparatus.

Particle-optical apparatus are used in e.g. the semiconductor industry for the inspection and analysis of samples taken from wafers. Another usage of such apparatus is in the field of biological research, where these apparatus are used for e.g. the analysis of pharmaceutical drugs and/or cell tissues.

In a STEM an electron source produces a beam of electrons, which electrons are accelerated to an energy of e.g. 300 keV. One or more condenser lenses make an image of the electron source, which image is subsequently focussed on the sample to be analysed. Magnetic and/or electric deflection fields enable the scanning of the beam over the sample. Part of the electrons will pass through the sample, to be imaged by one or more projection lenses onto an image plane. This image plane can coincide with a fluorescent screen, or it can coincide with a CCD camera. Other detectors might be used to detect other information, such as the signal obtained from deflected or backscattered electrons, generated X-ray radiation, etc.

Particle-optical apparatus often use particle-optical lenses that are magnetic or electrostatic monopole lenses (that is: the magnetic or electric field of these lenses show a rotational symmetry around the lens axis). Such lenses inevitably show spherical and chromatic aberrations. In modern apparatus the aberrations of the objective lens is corrected with a corrector. To adjust such a corrector properly it is necessary to determine the aberrations to be corrected.

In the known method an electron beam is focussed on a transmission sample, and a $1^{st}$ Ronchigram is formed on a CCD camera and recorded by that CCD camera. Then the beam is moved over the sample and a $2^{nd}$ Ronchigram is recorded. Using these two Ronchigrams the local magnification on different positions in the Ronchigrams is determined, from which local magnification the $2^{nd}$ derivative of the aberration function $\chi$ is derived.

The aberration function is known to the skilled person from e.g. "Upper limits for the residual aberrations of a high-resolution aberration-corrected STEM", M. Haider et al, Ultramicroscopy 81 (2000), page 168, formula (2).

The known method determines the second derivate by determining feature shifts caused by a change in beam position w.r.t. the sample. A correct value is only obtained for an infinitesimal small change in beam position. However, as a change in position must be observed, a large shift is preferred to eliminate e.g. the effects of sample drift occurring during the recording of a Ronchigram or occurring between the recording of different Ronchigrams, as well as problems relating to the limited spatial resolution of e.g. the CCD camera, resulting in spatial quantization noise. These conflicting requirements limit the accuracy and thus the usefulness of the known method.

It is an object of the invention to provide a method with improved accuracy over the known method.

To that end the method according to the invention is characterized in that the $1^{st}$ derivative of the aberration function as a function of the position in the image plane of the lens is defined as a polynomial function with coefficients to be determined, for a plurality of sample details the position of the image of the sample details is determined in each of the Ronchigrams, giving a plurality of position pairs, with the use of these position pairs and with the use of an algorithm, said algorithm dependent on the type of beam parameter changed, the coefficients of the polynomial function are determined by solving a set of equations.

The invention is based on the insight that with the use of a proper algorithm it is possible to determine the first derivative of the aberration function from two Ronchigrams of an amorphous sample. The invention is further based on the insight that the use of the first derivative of the aberration function allows a larger change of the beam position with respect to the sample than using the $2^{nd}$ derivative, as used in the known method of U.S. Pat. No. 6,552,340. As a consequence the resultant change in position of a sample feature between the Ronchigrams for the method according to the invention is also larger, thus resulting (at a given spatial resolution) in an image registration with a smaller relative error than with the known method and thus a more accurate determination of the aberration coefficients.

Further Elucidation of the Theoretical Background of the Invention

The image plane of the lens (perpendicular to the symmetry axis of the lens) can be described by an x- and y-axis with the origin at the symmetry axis of the lens (the z-axis coinciding with the lens axis). The aberration function in the image plane of the lens (which plane is perpendicular to the axis of the lens, herewith defined as the z-axis) is given by $$\chi(\omega) = \text{Re}\Big\{ A_o \overline{\omega} + \frac{1}{2}\overline{\omega}^2 A_1 + \frac{1}{2}\omega\overline{\omega}C_1 + \frac{1}{3}\overline{\omega}^3 A_2 + \omega^2 \overline{\omega} B_2 + \quad [1]$$
$$\frac{1}{4}\overline{\omega}^4 A_3 + \frac{1}{4}(\omega\overline{\omega})^2 C_3 + \omega^3 \overline{\omega} S_3 + \frac{1}{5}\overline{\omega}^5 A_4 + \omega^3 \overline{\omega}^2 B_4 +$$
$$\omega^4 \overline{\omega} D_4 + +\frac{1}{6}\overline{\omega}^6 A_5 + \frac{1}{6}(\omega\overline{\omega})^3 C_5 + \omega^4 \overline{\omega}^2 S_5 + \omega^5 \overline{\omega} D_5 + \ldots \Big\}$$

with $\omega = (x+iy)/f$, the complex coordinates in the image plane divided by the focal length of the lens, and $\overline{\omega}$ its complex conjugate. The coefficients relate to various lens aberrations as given in table 1.

TABLE 1 coefficients of the aberration function
and corresponding lens aberrations

| Coefficient | Name of corresponding lens aberration |
| --- | --- |
| $A_0$ | Shift |
| $A_1$ | Two-fold axial astigmatism or axial astigmatism of the $1^{st}$ order |
| $C_1$ | Defocus or spherical aberration of the $1^{st}$ order |
| $A_2$ | Three-fold axial astigmatism or axial astigmatism of the $2^{nd}$ order |
| $B_2$ | Axial coma |
| $A_3$ | Four-fold axial astigmatism or axial astigmatism of the $3^{rd}$ order |
| $C_3$ | Spherical aberration of the $3^{rd}$ order |
| $S_3$ | Axial star aberration of the $3^{rd}$ order |
| $A_4$ | Five-fold axial astigmatism or axial astigmatism of the $4^{th}$ order |
| $B_4$ | Axial coma |
| $D_4$ | Three lobe aberration of the $4^{th}$ order |
| $A_5$ | Six-fold axial astigmatism or axial astigmatism of the $5^{th}$ order |
| $C_5$ | Spherical aberration of the $5^{th}$ order |
| $S_5$ | Axial star aberration of the $5^{th}$ order |
| $D_5$ | Four lobe aberration of the $5^{th}$ order |

The coefficients of spherical aberration (C1, C3 and C5) are real numbers, while all other aberration coefficients are complex. The real and imaginary parts represent two independent contributions to the aberration. Consequently in equation [1] and table 1 there are actually 27 individual aberration coefficients present (25 when shift is not taken into account).

It will now be shown how from a set of Ronchigrams the coefficients for the first derivative of the aberration function can be determined. A one dimensional description of the problem is given (showing only the effect of changes in the x-direction). However, the conclusions are valid for a two dimensional system (in x and y) as well. It is assumed that the first Ronchigram is made in a situation that the paraxial image plane coincides with the plane where the sample resides, although this is not necessary for the method according to the invention.

A beam irradiating the sample can be thought to consist of a large number of rays. A certain sample feature present on the sample is imaged by a particular ray onto e.g. the CCD camera. For each Ronchigram and each sample feature a particular ray in the beam can be identified responsible for imaging said sample feature onto the camera plane. The magnification M between the camera plane and the aperture plane of the lens is given by M=L/f, with f the focal length of the lens and L the so-called camera length.

The distance from such a ray to the optical axis is described by $$r_1(z) = -\left(\frac{x_a}{f} + \frac{\partial \chi}{\partial x}\bigg|_{x_a}\right)z + x_a \quad [2]$$

where $x_a$ denotes the position of the sample feature projected back to the aperture plane of the lens, $x_a/f$ denotes the slope of the non-aberrated ray with respect to the axis of the lens and $$\frac{\partial \chi}{\partial x}\bigg|_{x_a}$$

denotes the deviation of this slope due to lens aberrations.

The second Ronchigram is recorded with a changed beam parameter.

As a first example the beam is slightly defocused with a defocus $\Delta C_1$. The same feature is now imaged by another ray, whose distance from the axis is described by $$r_2(z) = -\left(\frac{x_b}{f} + \frac{\partial \chi}{\partial x}\bigg|_{x_b} + \frac{\Delta C_1}{f^2}x_b\right)z + x_b \quad [3^a]$$

where $x_b$ denotes the position of the sample feature projected back to the aperture plane of the lens.

As a second example for the beam used to record the second Ronchigram, the beam is slightly shifted by a known beam shift S. The same feature is now imaged by another ray, whose distance from the axis is described by $$r_2(z) = -\left(\frac{x_b}{f} + \frac{\partial \chi}{\partial x}\bigg|_{x_b} + \frac{S}{f}\right)z + x_b \quad [3^b]$$

As a third example for the beam used to record the second Ronchigram, the beam is slightly tilted by a known beam tilt $\tau$. The same feature is now imaged by another ray, whose distance from the axis is described by $$r_2(z) = -\left(\frac{x_b}{f} + \frac{\partial \chi}{\partial x}\bigg|_{x_b} + \frac{\Delta p - C_1}{f}\tau\right)z + x_b \quad [3^c]$$

where $\Delta p$ denotes the position on the optical axis of the pivot point with respect to the sample, and $C_1$ is the defocus (see also table 1).

From the above formulae [3] it can be derived that the relation between the initial position in the first Ronchigram $x_a$ and the final position in the second Ronchigram $x_b$ can be written as:

in the case of a defocus $\Delta C_1$ $$f\left(\frac{\partial \chi}{\partial x}\bigg|_{x_a} - \frac{\partial \chi}{\partial x}\bigg|_{x_b}\right) = \frac{\Delta C_1}{f}x_b \quad [4^a]$$

in the case of a beam shift S $$f\left(\frac{\partial \chi}{\partial x}\bigg|_{x_a} - \frac{\partial \chi}{\partial x}\bigg|_{x_b}\right) = S \quad [4^b]$$

and in the case of a beam tilt τ

$$f\left(\frac{\partial \chi}{\partial x}\bigg|_{x_a} - \frac{\partial \chi}{\partial x}\bigg|_{x_b}\right) = (\Delta p - C_1)\tau \quad [4^c]$$

As mentioned earlier, according to the invention the derivative $$\frac{\partial \chi}{\partial x}\bigg|_x$$

is written as a polynomial with coefficients to be determined. Each of formulae [4] gives for one sample feature a set of $$\frac{\partial \chi}{\partial x}\bigg|_x$$

at two different positions, $x_a$ and $x_b$. By determining the image shift for many different image features, many of these sets are determined. Solving these many sets then gives the coefficients of the first derivative of the aberration function, from which coefficients the aberration coefficients itself can be derived.

It is remarked that the effect of drift, which results in a uniform shift of the $2^{nd}$ Ronchigram relative to the $1^{st}$ Ronchigram, can be eliminated, as it is not position dependent. Drift is then an extra parameter which can be determined as an extra coefficient in the set of coefficients to be determined.

It is further remarked that it is not necessary that the number of equations to be solved corresponds exactly with the number of coefficients. When a larger number of equations (a larger number of sets) are used, parameter fitting can be performed resulting in improved accuracy.

It is remarked that in U.S. Pat. No. 6,858,844 another method is described to determine the beam profile by recording a so-called 'through-focus series' of scanned images, that is a series of images using different defocus values of the beam. A deconvolution of the images thus obtained then gives the beam profiles at different defocus distances from the focal point. The differences of these profiles are then used to determine beam aberrations.

A disadvantage of this method is that many images must be acquired in STEM mode (so: by scanning the beam over the sample). As is well-known to a person skilled in the art of TEM and STEM microscopy, making such an image is more time consuming then making a Ronchigram. Another disadvantage is that the sample must be of a type suited for deconvolution, implying a sample with well defined features. Therefore the sample used for the method of U.S. Pat. No. 6,858,844 is often of a special type, and after having determined the aberration coefficients (and having adjusted the corrector to minimize the aberrations), the sample must be taken out of the apparatus and the sample to be analysed must be inserted. This is time consuming, while there is also the risk that the behaviour of the corrector is influenced by the exchange, e.g. because of temperature changes due to such an exchange, resulting in an incorrect adjustment.

Embodiments of the Invention

In an embodiment of the method according to the invention the change in beam parameter involves a change in the angle of the beam relative to the sample. This embodiment is described by formula $4^c$.

In another embodiment of the method according to the invention the change in beam parameter involves a change in the focal length of a lens. This embodiment is described by formula $4^a$.

It is to be remarked that to obtain such a change in the beam position it is not necessary to change the focal length of the lens focussing the beam onto the sample. By changing the strength of another lens between source and said lens the beam is displaced as well. This might have the advantage that a larger change in the (magnetic) field of such a lens can be used, with as a consequence less interference by e.g. magnetic hysteresis.

In yet another embodiment of the method according to the invention the change in beam parameter involves a shift of the beam relative to the sample. This embodiment is described by formula $4^b$.

It is remarked that, although this change in position between the recording of the Ronchigrams is also disclosed in the method known from U.S. Pat. No. 6,552,340, the method according to the invention determines the coefficients in a different way. Therefore the method according to the invention differs from the method known from U.S. Pat. No. 6,552,340 as well.

In a further embodiment of the method according to the invention the change in position is caused by an electric or magnetic field. Although the change in position can be caused mechanically, it is much easier to obtain such a change by changing magnetic or electric fields. This is especially so because the changes required are very minute and must be known with an accuracy corresponding to almost atomically dimensions.

In still another embodiment the change in beam parameter involves a change in beam energy.

In a further embodiment of the method according to the invention all features recorded in the $2^{nd}$ Ronchigram are spatially pre-adjusted by an expected shift value before the relative displacement of the specimen details is determined.

In yet a further embodiment of the method according to the invention a corrector is adjusted based on the coefficients determined.

It is remarked that the method according to the invention might be used in an iterative way until e.g. all aberrations are smaller than certain preset values.

The invention will be elucidated on the basis of figures, where identical reference numerals indicate corresponding elements.

Figure 2:
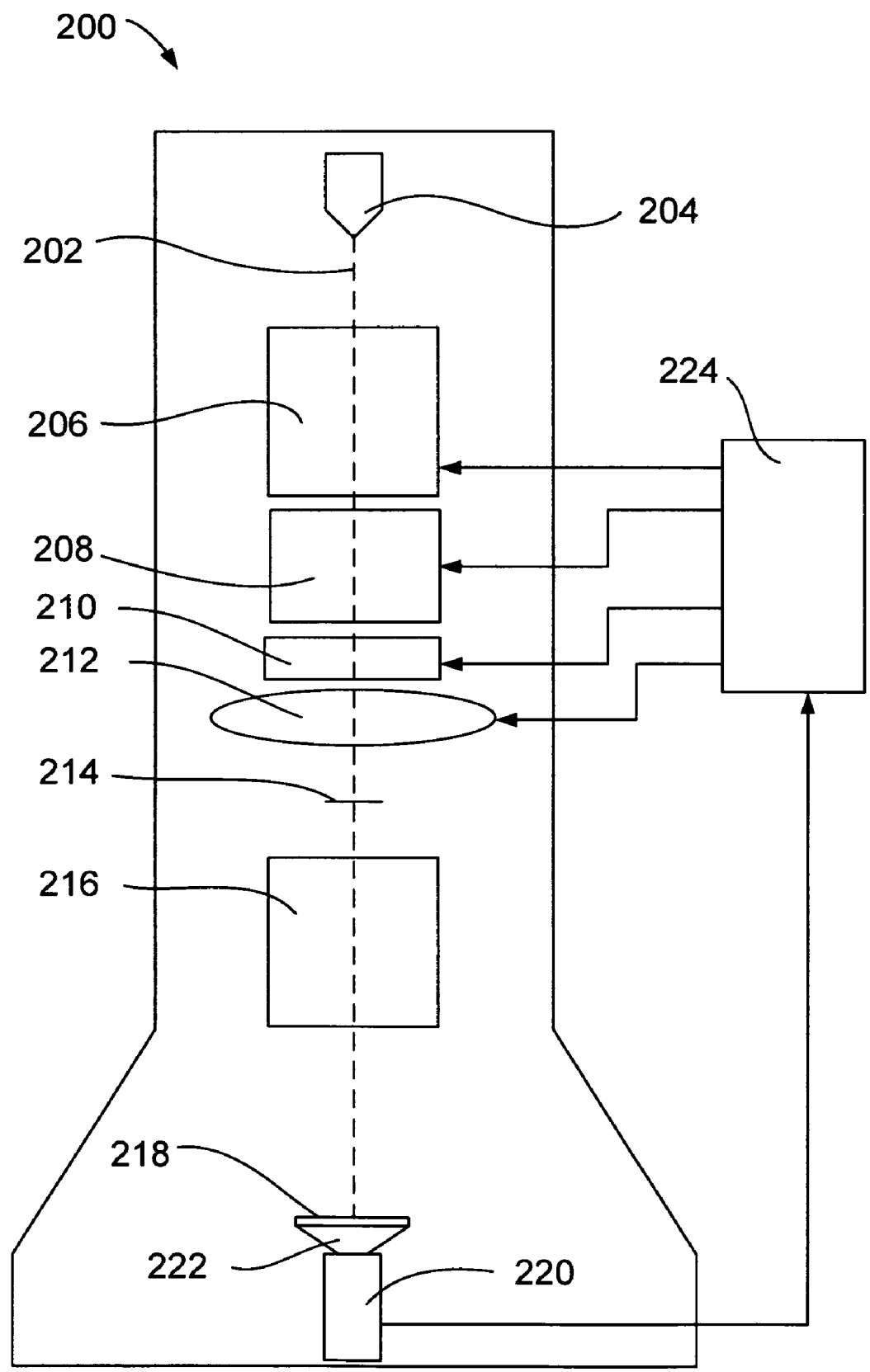
Figure 3:
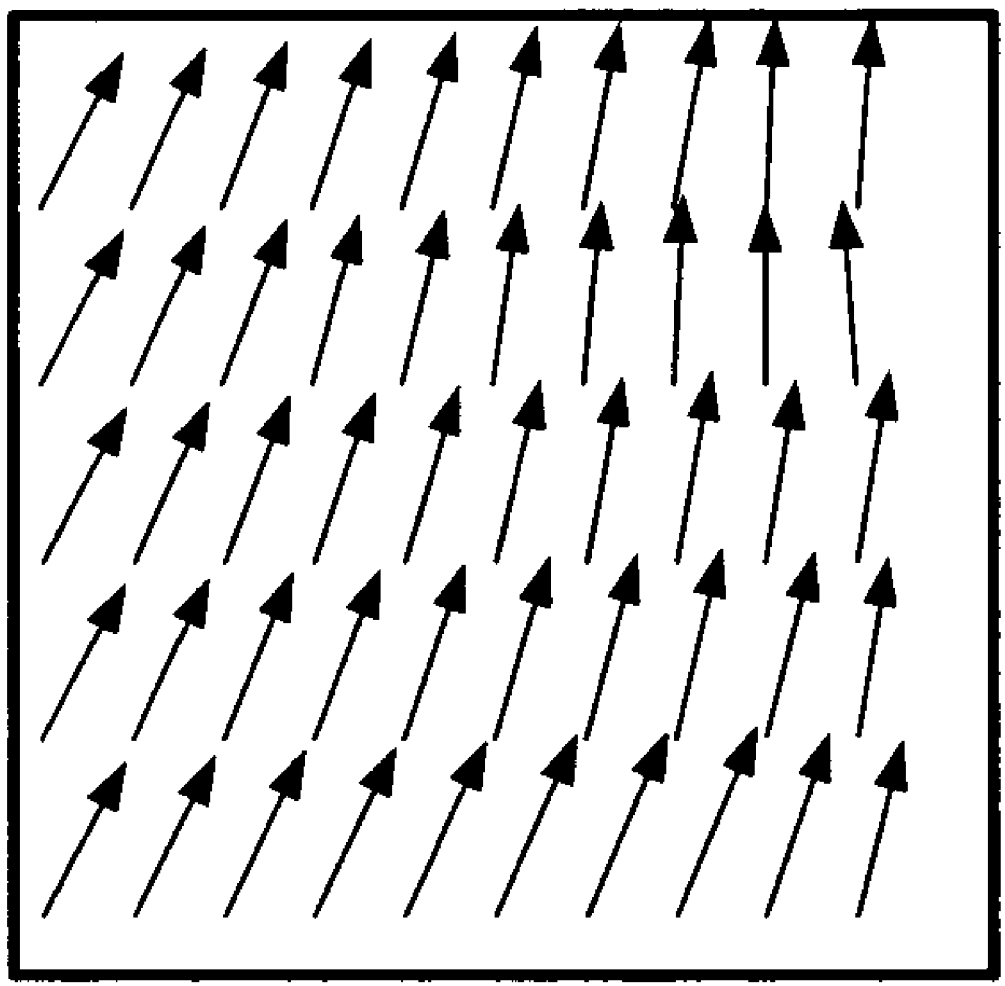

To this end:

FIG. 1 depicts schematically a lens with spherical aberration, imaging sample features on a screen, FIG. 2 depicts schematically a STEM equipped to perform the method according to the invention, and FIG. 3 depicts schematically a field of vectors, each vector indicating the displacement of a sample feature between 2 Ronchigrams.

FIG. 1 shows schematically a lens with spherical aberration, imaging sample features on a screen. A lens 101 with an optical axis 102 focuses a particle beam consisting of many rays 103 on the Gaussian focal point 104. The particles are projected on a projection screen 105, where they are recorded, e.g. by recording the light emitted by the screen 105 due to the particle bombardment. Due to spherical aberration of the lens 101 the rays 103 removed from the axis 102 are refracted too much and these rays intersect the axis 102 at a position between the Gaussian focal point 104 and the lens 101. On a $1^{st}$ sample plane 110 two sample features are depicted, a $1^{st}$ feature 111 on the axis and a $2^{nd}$ feature 113 located at an off-axis position. The $1^{st}$ feature, intercepting the central ray of the beam, will produce a shadow image on the screen 105 at location 112, the $2^{nd}$ feature 113, intercepting ray 115, will produce a shadow image at location 114.

The magnification of the sample features on the screen 105 depends on the place where the rays 103 intercepted by that feature pass the axis 104 and the distance from sample plane to the screen 105. As the distance from the sample to the screen 105 (the so-called camera length) in reality is much larger than the distance from sample to lens, which in turn is much larger than the different positions where the rays intersect the optical axis, the distance from the sample plane to the screen can be assumed to be almost constant (typical values for the camera length are tens of centimetres while the focal length of the lens is typically several millimetres, while the distance from the sample position to the focal plane is typically chosen less than 100 μm). Therefore the magnification of features on the sample changes dramatically when part of the images features are located at or very close to the focal plane of the lens.

As the (central part of the) $1^{st}$ feature coincides with the focal point, it is imaged with an infinite magnification. The $2^{nd}$ feature, removed from the focal plane, is magnified much less.

When the sample is now shifted to another sample plane 120 located at a distance Δf 106 away from the lens, the $1^{st}$ feature, now at position 121, forms its shadow image at position 122, coincident with the position 112 formed previously on the screen 105, although its magnification is changed.

The $2^{nd}$ feature, now positioned at location 123, forms a shadow image at position 124, which is displaced w.r.t. position 114 formed previously on the screen 105. Its magnification is changed much less than that of the $1^{st}$ feature, as the change in distance where the intercepted rays 115, 125 pass the optical axis relative to the sample plane is much less.

It is remarked that if the sample is placed between the Gaussian focal point 104 and the position where the outermost rays intersect the optical axis 102, there will be a ring on the screen 105 around the optical axis 102 where the magnification of the sample is infinite. This causes the circular patterns often observed on Ronchigrams. As a consequence the magnification of the $1^{st}$ feature, located inside this ring, will have an opposite sign from the magnification of the $2^{nd}$ feature, located outside this ring.

It is also remarked that for the method according to the invention it is undesirable to have such a ring of infinite magnification on the screen. Such a ring makes it difficult to determine the shift of a feature between the different Ronchigrams. Therefore the Ronchigrams recorded while performing the method according to the invention are preferably made with the Gaussian focal plane between lens and sample plane(s), that is with a slight over-focus of the lens.

Assuming that the change in position 106 of the sample is known, the spherical aberration and other aberrations can be deduced from the relative movement and magnification of the images of the features.

Although the above example uses a defocus as the different beam position w.r.t. the sample, it will be obvious that similar results can be obtained when a beam tilt or a beam shift is applied.

It is remarked that to improve the accuracy of the method it is possible to record further Ronchigrams and to determine the aberration coefficients based on a set of e.g. three Ronchigrams.

FIG. 2 depicts schematically a STEM equipped to perform the method according to the invention.

In a STEM 200 a particle source in the form of an electron source 204 emits a beam of electrons along an optical axis 202. The electron source 204 is imaged by condenser optics 206 and passes through a corrector 208, said corrector correcting the aberrations of objective lens 212. Before the objective lens 212 a deflector unit 210 is placed, with which the beam can be scanned over the sample. The objective lens 212 focuses the beam onto the sample position 214, on which sample position 214 a sample is positioned. Electrons passing through the sample are imaged by projector optics 216 onto a fluorescent layer 218. In response to the electron bombardment this layer emits light, to be detected by camera 220 via fibre optics 222. The image detected by camera 220 is fed to a controller 224, which records and analyses the images coming from the camera and controls e.g. the condenser optics 206, the deflector unit 208, the corrector 210 and the objective lens 212.

According to the invention the controller 224 records a $1^{st}$ Ronchigram, Then a beam parameter is changed by e.g. changing the focal length of the objective lens 212, thus introducing a slight defocus Δf, and a $2^{nd}$ Ronchigram is recorded. These two Ronchigrams are then compared, and for a large number of sites the positions of corresponding images of sample details (that is: the image positions of the same sample detail in the $1^{st}$ and in the $2^{nd}$ Ronchigram) are determined. From these position pairs and using one of formulae [$4^a$], [$4^b$] or [$4^c$] (depending on the type of beam parameter changed) a set of equations result. By solving this set of equations the coefficients of the first derivative of the aberration function are determined, and the corrector 208 can be adjusted to reduce the aberrations present.

FIG. 3 shows schematically a representation of the shifts determined when comparing two Ronchigrams. Each of the vectors represents a shift in position of an image feature between the $1^{st}$ and the $2^{nd}$ Ronchigram, that is: the beginning of each vector represents the position of a certain sample feature in the $1^{st}$ Ronchigram and the end of each vector represents the position of said sample feature in the $2^{nd}$ Ronchigram.

The invention claimed is:
1. A method for determining the aberration coefficients of the aberration function of a particle-optical lens, comprising:
  providing an amorphous sample with sample details,
  providing a beam of particles,
  providing a lens for focusing said beam in the vicinity of the sample,
  recording a $1^{st}$ transmission Ronchigram showing an image of a plurality of sample details,
  changing a beam parameter by a known quantity,
  recording a $2^{nd}$ transmission Ronchigram showing an image of approximately the same sample details,
  characterized in that
  the $1^{st}$ derivative of the aberration function as a function of the position in the image plane of the lens is defined as a polynomial function with coefficients to be determined, for a plurality of sample details the position of the image of the sample details is determined in each of the Ronchigrams, giving a plurality of position pairs, with the use of these position pairs and with the use of an algorithm, said algorithm dependent on the type of beam parameter changed, the coefficients of the polynomial function are determined by solving a set of equations.

2. The method according to claim 1, in which the change in beam parameter involves a change in the angle of the beam relative to the sample.

3. The method according to claim 1, in which the change in beam parameter involves a change in the focal length of a lens.

4. The method according to claim 1, in which the change in beam parameter involves a shift of the beam relative to the sample.

5. The method according to claim 1, in which the change is caused by a change of an electrostatic or magnetic field.

6. The method according to claim 1, in which the change in beam parameter involves the change of the energy of the beam.

7. The method according to claim 1, in which the position of all features recorded in the 2nd Ronchigram are spatially pre-adjusted by an expected shift value before the relative displacement of the specimen details is determined.

8. The method according to claim 1, which a corrector is adjusted based on the aberration coefficients determined.

9. A particle-optical apparatus comprising:
a stage for holding an amorphous sample having sample features;
a source of particles for forming a beam of particles;
a lens for focusing said beam in the vicinity of the sample, the lens having aberration characterized by an aberration function;
a detector positionable at an image plane for recording an image;
a corrector adjustable for compensating for lens aberration;
a controller for determining the adjustment of the corrector, the adjustment based on the aberration function, the controller being programmed to determine the aberration function from a first derivative of the aberration function, the first derivative being determined by:
recording a first transmission Ronchigram showing an image of a plurality of the sample features;
changing a beam parameter by a known quantity;
recording a second transmission Ronchigram showing an image of approximately the same sample features; and
the controller being programmed to calculate the first derivative of the aberration function as a function of the position in the image plane of the lens by defining the first derivative as a polynomial function with coefficients to be determined, wherein
for a plurality of sample features the position of the image of the sample features is determined in each of the Ronchigrams, giving a plurality of position pairs, and
with the use of these position pairs and with the use of an algorithm, the algorithm dependent on the type of beam parameter changed, the coefficients of the polynomial function are determined by solving a set of equations.

10. The apparatus according to claim 9, in which software is used for automatically performing the method according to claim 1.

11. A method of determining aberration coefficients for the known polynomial aberration function for a particle-optical lens, comprising:
obtaining a first Ronchigram by imaging a sample feature using a particle beam;
identifying a first position of an image of the sample feature in the first Ronchigram;
changing a particle beam parameter;
obtaining a second Ronchigram by imaging the sample feature using the particle beam with the changed particle beam parameter;
identifying a second position of an image of the sample feature in the second Ronchigram, said second position forming a position pair with the first position of the sample feature;
performing the above steps for a plurality of sample features, yielding a plurality of position pairs;
using an algorithm, said algorithm dependent on the type of particle beam parameter changed, to determine a set of first derivative values of the aberration function for the plurality of position pairs;
determining the coefficients of the first derivative of the aberration function using the set of first derivative values for the plurality of position pairs; and
using said coefficients of the first derivative of the aberration function to derive the coefficients of the aberration function.

12. The method of claim 11, in which changing a particle beam parameter includes tilting the particle beam or shifting the particle beam or defocusing the particle beam.

13. The method of claim 11, further comprising adjusting a corrector based on the derived coefficients of the aberration function.

* * * * *